United States Patent [19]

Leroux

[11] Patent Number: 5,856,052

[45] Date of Patent: Jan. 5, 1999

[54] WAFER WITH A FOCUS/EXPOSURE MATRIX

[75] Inventor: Pierre Leroux, San Antonio, Tex.

[73] Assignee: VLSI Technology, Inc., San Jose, Calif.

[21] Appl. No.: 848,541

[22] Filed: Apr. 28, 1997

Related U.S. Application Data

[62] Division of Ser. No. 579,489, Dec. 27, 1995.

[51] Int. Cl.$^6$ ....................................................... G03C 3/00
[52] U.S. Cl. .................................................. 430/18; 430/9
[58] Field of Search ............................................ 430/18, 9

[56] References Cited

U.S. PATENT DOCUMENTS

| | | | |
|---|---|---|---|
| 4,610,940 | 9/1986 | Araihara | 430/22 |
| 5,049,925 | 9/1991 | Aiton et al. | 355/53 |
| 5,100,508 | 3/1992 | Yoshida et al. | 430/312 |
| 5,362,585 | 11/1994 | Adams | 430/311 |

*Primary Examiner*—M. Nuzzolillo
*Assistant Examiner*—Laura Weiner
*Attorney, Agent, or Firm*—Majestic, Parsons, Siebert & Hsue P. C.

[57] ABSTRACT

A focus/exposure matrix comprises a series of patterns disposed on a wafer. The patterns are arranged in rows and columns. The patterns in a row are characterized by having been formed with substantially the same exposure time and an effective focus that increments between successive row patterns by an amount substantially corresponding to half the focus resolution of the photostepper. The patterns in a column are characterized by having been formed with substantially the same effective focus and an exposure time that increments between successive column patterns by a finite amount.

8 Claims, 6 Drawing Sheets

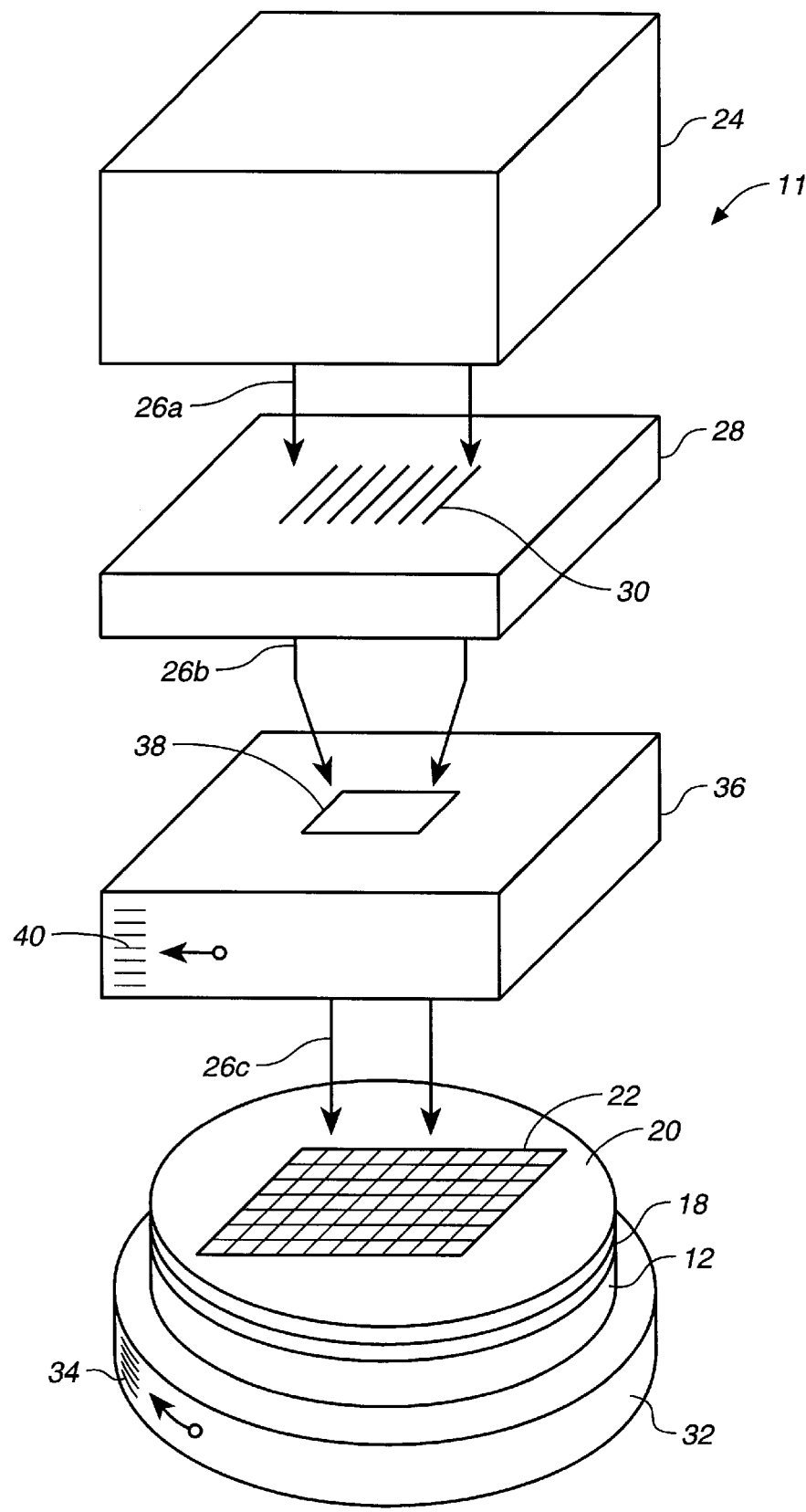
FIG._1

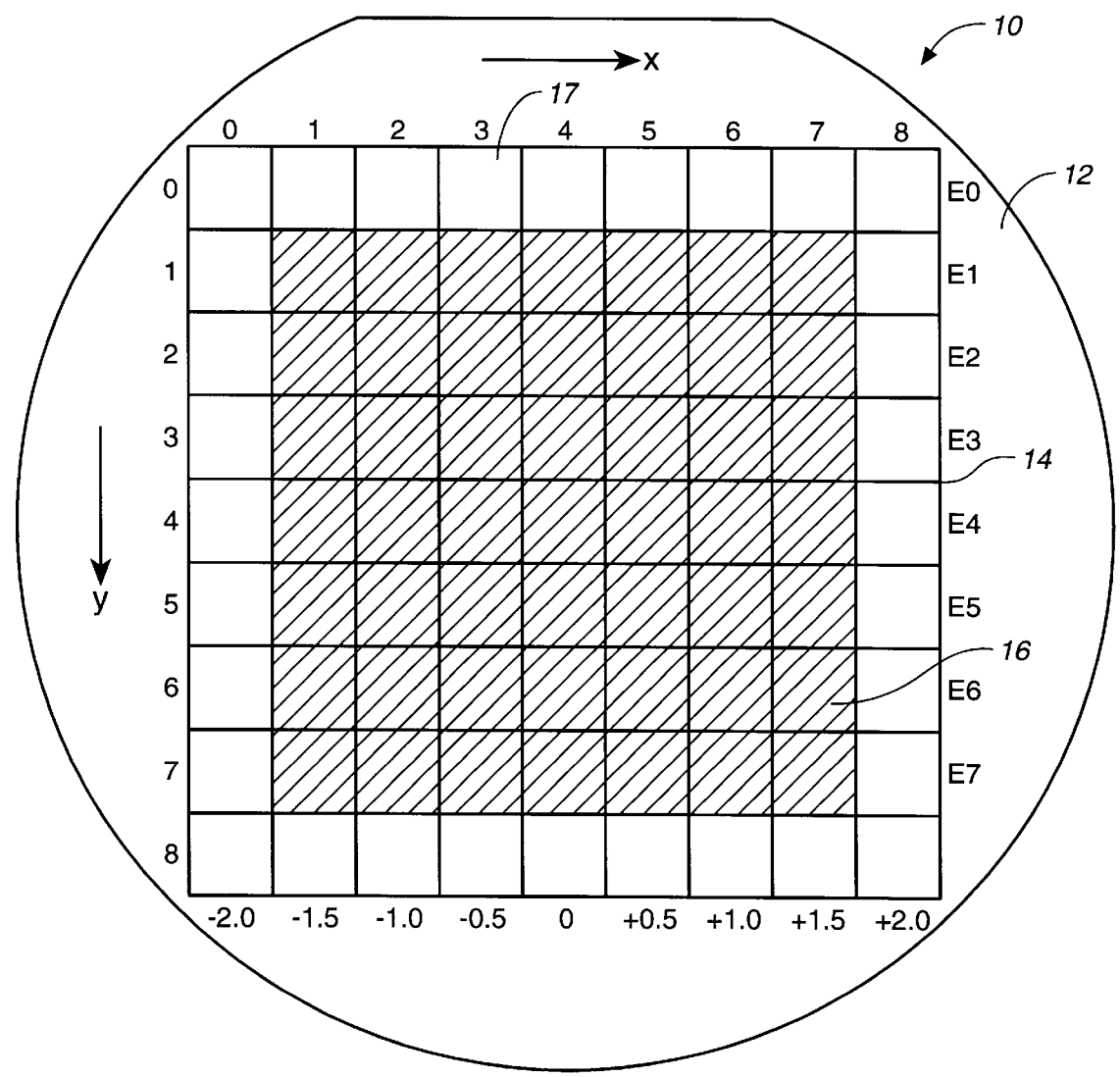
FIG._2

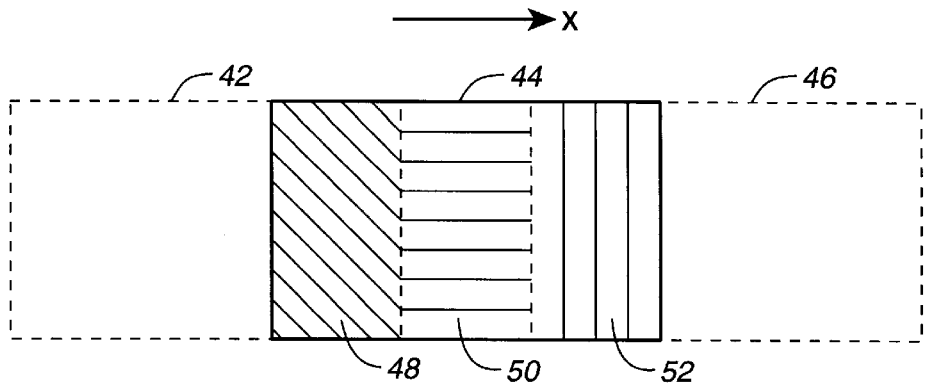
FIG._3
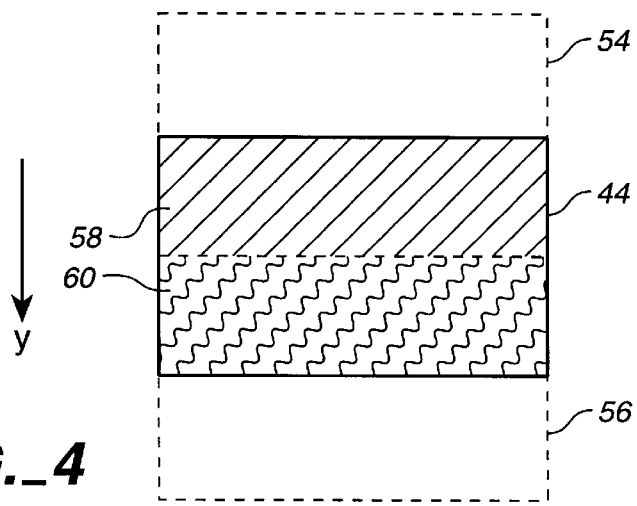
FIG._4
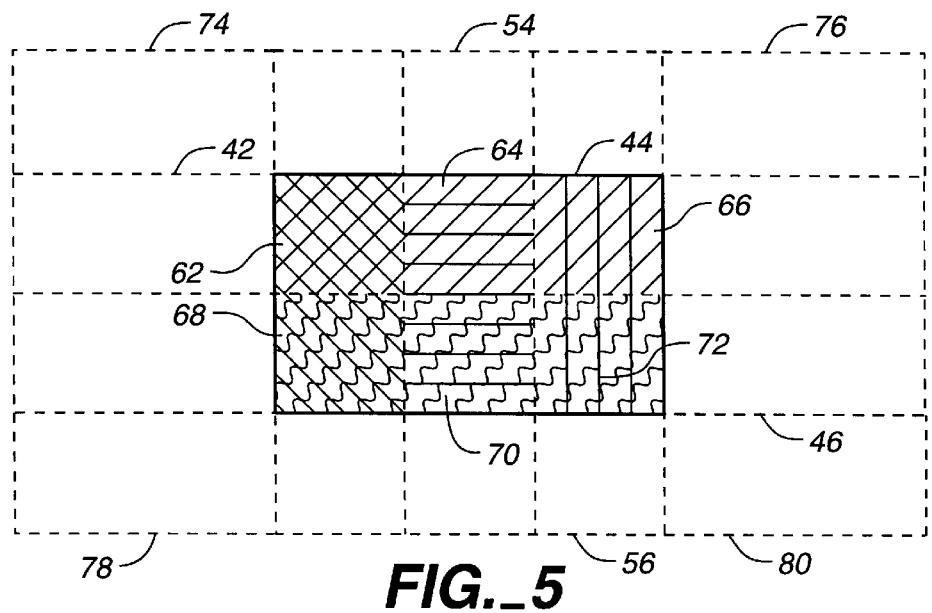
FIG._5

FIG._6

| EXPOSURES | OVERLAY EXPOSURE REGIONS ($\frac{FOCUS}{EXPOSURE\ TIME}$) | | | | | | |
|---|---|---|---|---|---|---|---|
| | 62 | 64 | 66 | 68 | 70 | 72 |
| 74 | -0.1 $E_a$ | | | | | |
| 54 | 0 $E_a$ | 2(0) $2E_a$ | 0 $E_a$ | | | |
| 76 | | | +0.1 $E_a$ | | | |
| 42 | -0.1 $E_b$ | | | -0.1 $E_b$ | | |
| 44 | 0 $E_b$ | 2(0) $2E_b$ | 0 $E_b$ | 0 $E_b$ | 2(0) $2E_b$ | 0 $E_b$ |
| 46 | | | +0.1 $E_b$ | | | +0.1 $E_b$ |
| 78 | | | | -0.1 $E_c$ | | |
| 56 | | | | 0 $E_c$ | 2(0) $2E_c$ | 0 $E_c$ |
| 80 | | | | | | +0.1 $E_c$ |
| EFFECTIVE $\frac{FOCUS}{EXPOSURE\ TIME}$ | $\frac{-0.5}{2(E_a+E_b)}$ | $\frac{0}{2(E_a+E_b)}$ | $\frac{+0.5}{2(E_a+E_b)}$ | $\frac{-0.5}{2(E_b+E_c)}$ | $\frac{0}{2(E_b+E_c)}$ | $\frac{+0.5}{2(E_b+E_c)}$ |

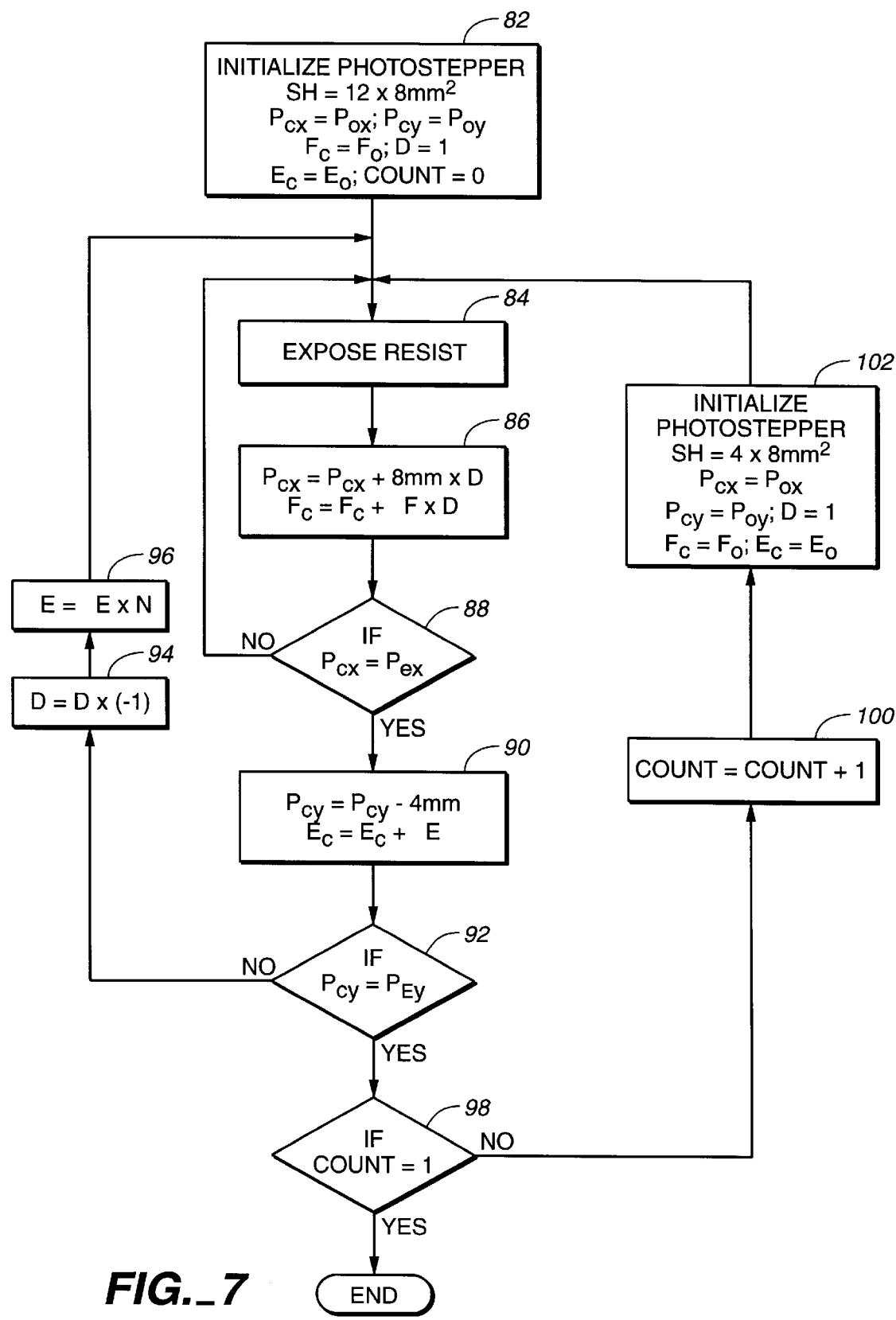
FIG._7

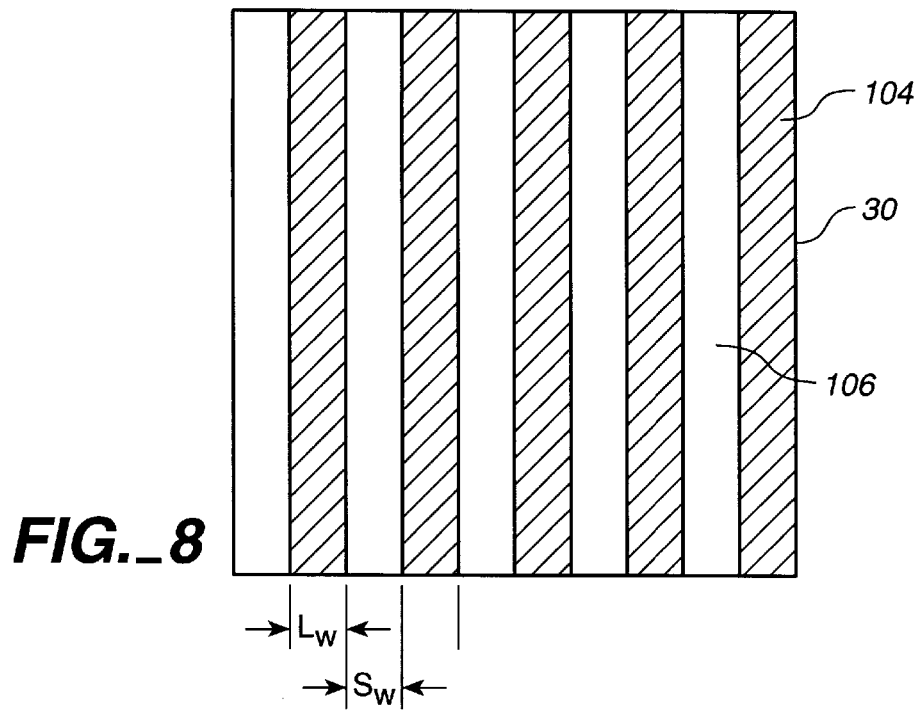
FIG._8
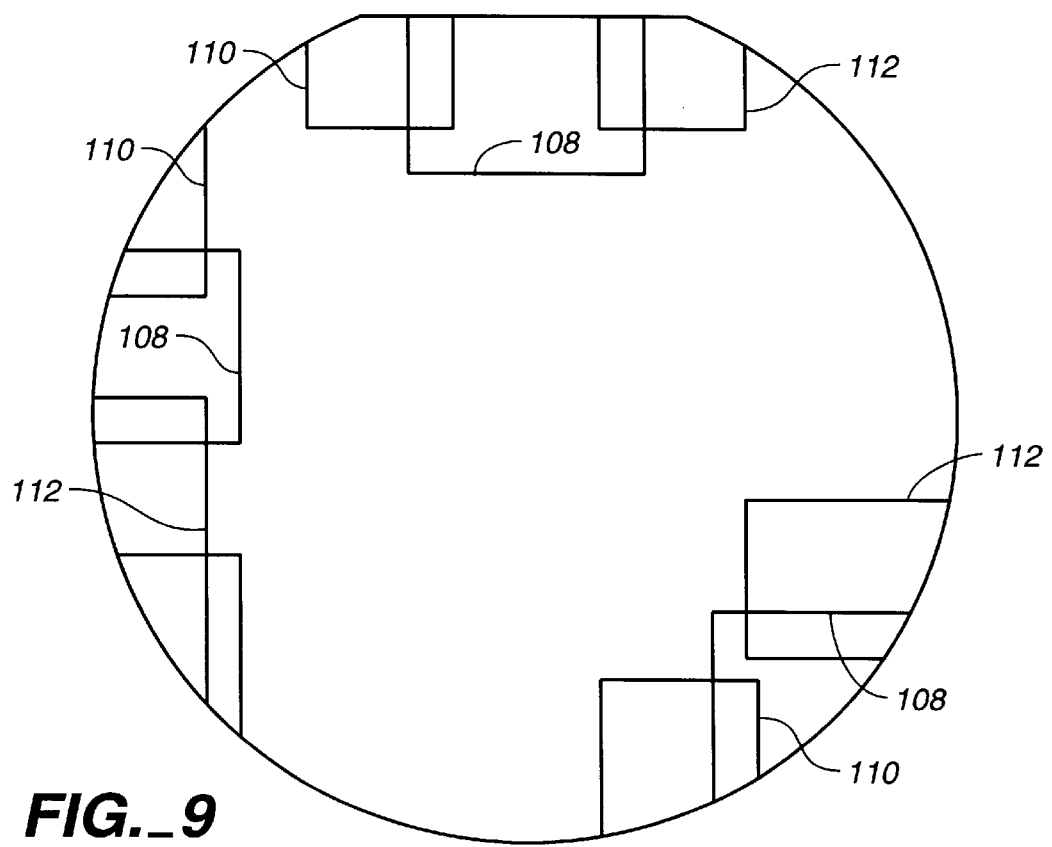
FIG._9

WAFER WITH A FOCUS/EXPOSURE MATRIX

This is a division of application Ser. No. 08/579,489, filed Dec. 27, 1995.

FIELD OF THE INVENTION

This invention relates to a method of making a reference wafer for use in calibrating a photostepper, and in particular, a method of forming a focus/exposure matrix on the wafer.

BACKGROUND OF THE INVENTION

During the past twenty years, the developments in the field of manufacturing very large scale integrated circuits have been phenomenal. Circuits that used to occupy an entire room have been shrunken into a small integrated circuit, which may fit into, for example, a small calculator or computer. And still the aim of many in the industry is to further reduce the size of circuits so as to occupy even smaller areas.

As circuits are reduced in size, each component within each circuit is likewise reduced in size. The problem, however, lies in manufacturing these smaller components without degrading the function and performance of the circuits. This is where each component's line and space definitions are crucial in the production of these integrated circuits. Such line and spacing definitions are approaching dimensions near a tenth of a micron. Therefore, there is a need to have accurate equipment and manufacturing techniques in manufacturing these types of integrated circuits.

One equipment commonly used in manufacturing very large scale integrated circuit is a photostepper. A photostepper is used to expose a layer of resist disposed over a thin-film covered wafer to electromagnetic radiation spatially modulated with a circuit pattern. The photostepper usually steps and repeats the exposure of the resist so as to form images of multiple circuit patterns on the resist. The wafer is subsequently removed and the wafer is subjected to an etching process for removing the resist and part of the thin-film so as to leave a thin-film pattern disposed on the wafer defining the multiple circuit patterns.

The manner in which a photostepper exposes the layer of resist is by projecting an image of the circuit pattern towards the wafer. A reticle or mask having a series of darken images disposed thereon defining the circuit pattern is interposed between a light source and the wafer, and a controllable shutter is interposed between the mask and the wafer. The light source is constantly energized and the photostepper periodically opens its shutter so that electromagnetic energy having the proper wavelength emanating from the light source and propagating through the image on the mask strikes the resist. The shutter is thereafter moved to a different position over the wafer and another exposure is conducted. Generally, this is performed until an array of exposures is formed on the resist.

The exposing of the resist process is a critical step in obtaining well-defined circuit patterns on the wafer. This step becomes more critical as the dimensions of the lines and spacings of the circuit become smaller. In other words, precise exposure time and focus are required in order to optimize the image exposed on the wafer. A photostepper usually has multiple settings of exposure time and focus. One set of exposure time and focus settings being optimal in obtaining best circuit patterns. Therefore, there is a need to determine these precise settings of the photostepper to optimize the definitions of the circuit pattern disposed on the wafer.

The determination of the optimum focus and exposure settings is an on-going process. Usually, this determination should be conducted prior to manufacturing a production run of circuit patterns. The reason for constantly calibrating the photostepper is that various factors that affect the exposure of the resist change over time. For example, changes in barometric pressure or excessive opening of the photostepper's side panel may cause the optimum focus and exposure time settings to change. In addition variation in wafer, thin-film and/or resist also has an effect on the optimum settings of the photostepper. Therefore, there is a need for a technique that can be performed on a regular basis for calibrating the photostepper so that the optimum focus and exposure time settings are obtained prior to manufacturing a lot of production circuit wafers.

One technique used in obtaining these optimized settings is to form a focus/exposure matrix on the wafer. A focus/exposure matrix is a series of patterns disposed on the wafer usually arranged in rows and columns. A pattern may be formed by etching a thinfilm disposed over the wafer, or by etching the top surface of a bare wafer, or preferably, by etching a layer of resist disposed over the wafer. Each pattern having been formed with a distinct focus and exposure time, as for example, the patterns in a row having been formed with substantially the same exposure time and a focus that is incremented between successive row patterns by an amount substantially corresponding to the focus resolution of the photostepper and the patterns in a column having substantially the same focus and an exposure time that is incremented between successive column patterns by a finite amount. By examining the focus/exposure matrix to determine the pattern that has the best defined lines and spacings, an optimal set of exposure time and focus settings may be obtained.

The disadvantage with this method is that the photostepper has a margin of error in its focus. The margin of error may be as high as plus or minus the focus resolution of the photostepper. As a result, there will be an uncertainty as to whether the increment in focus between successive patterns is uniform. For example, if one pattern has an error of plus the focus resolution, and the succeeding pattern has an error of minus the focus resolution, both patterns would be exposed with the same focus, although they were created using different focus settings. The margin of error problem is also applicable to the exposure time. Hence using this method is not reliable for photostepper calibration and checking. Therefore, there is a need to create a focus/exposure matrix that is more reliable.

A technique has been developed in the prior art to create a focus/exposure matrix that is more reliable. This technique uses the concept of overlapping exposures to improve the reliability of each exposed pattern. When exposures are overlapped, it produces an image that has an effective focus that is the average focus of the overlapping exposures. For example, if a first exposure has been created with a focus setting of zero micron and a second exposure has been created with a focus setting of 0.1 micron, then the effective focus of the overlapping of these exposures is the average focus, i.e. 0.05 micron. The margin of error is statistically improved by this averaging effect. For example, if the first exposure has a positive error and the second exposure has a negative error, these errors would cancel out at the overlapping region since the focuses are averaged. The only way that the overlapping region's effective error would equal that of each individual exposure is if both exposures have the extreme error in the same direction, and statistically, this is unlikely. The result is an improvement in the accuracy in the overlapping regions.

A prior art technique of forming a focus/exposure matrix using overlapping regions generally uses a substantially square frame to form each pattern. First, the photostepper is positioned over the wafer at a strategic spot, for example, over a spot near an upper-left corner of the wafer. The photostepper then exposes the resist with an initial focus and exposure time. This exposure may be designated exposure (1,1), for example, since it is the upper-left corner exposure of the focus/exposure matrix. Assume that exposure (1,1) was exposed with an initial focus setting of −0.1 micron. Then the photostepper is moved one-half a frame in the x-direction, and exposure (1,2) is exposed with a 0 micron focus setting. The photostepper again is moved one-half a frame in the x-direction and exposure (1,3) is exposed with a +0.1 micron focus setting. Because the photostepper moves one-half a frame for each exposure, the right-half of exposure (1,1) is overlapped with the left-half of exposure (1,2); and similarly, the right-half of exposure (1,2) is overlapped with the left-half of exposure (1,3). The resulting overlapping regions have an effective focus of −0.05 and +0.05 micron, respectively. The technique may be used to create a row of overlapping regions having an effective focus ranging from, for example, of −2.5 micron to +2.5 micron, in steps of 0.1 micron (i.e. the focus resolution of the photostepper). After a row of exposures is created, the photostepper moves one-half a frame in the y-direction and creates a similar row of exposures with a different exposure time. This process is repeated until a two-dimensional array of exposures is formed.

One disadvantage with this technique is that the effective focus of each overlapping region does not correspond to a focus setting of the photostepper. For instance, in the above example, the photostepper has a focus setting of −0.1, 0 and +0.1 micron. But the overlapping regions have an effective focus of −0.05 and +0.05 micron. The effective focus of each overlapping region always differs from the focus setting of the photostepper by 0.05 micron. It is difficult to determine the optimum focus setting from a focus/exposure matrix such as this one where none of the patterns have been formed with an effective focus corresponding to one of the focus settings. Therefore, there is a need for a technique to form a focus/exposure matrix having patterns formed with effective focuses corresponding to the photostepper's focus settings.

Another disadvantage with this technique is that the difference in effective focus between adjacent overlapping regions is only as good as the focus resolution of the photostepper. For instance, in the above example, the effective focus of the overlapping regions were −0.05 and +0.05 micron, respectively. The difference in effective focus for these regions is 0.1 micron (i.e. +0.05 micron−(−0.05 micron)). The focus resolution of the photostepper, which is defined as the difference in closest focus settings, is also 0.1 micron. To achieve better accuracy in the photostepper calibration process, it is desirable to reduce the difference in effective focus between adjacent overlapping regions.

OBJECT OF THE INVENTION

Thus, it is an object of this invention to provide a method of forming a focus/exposure matrix on a wafer using overlapping exposure regions having effective focuses corresponding to focus settings of the photostepper.

Thus, it is another object of this invention to provide a method of forming a focus/exposure matrix on a wafer using overlapping exposure regions having an effective focus that increments between adjacent regions by an amount corresponding to half the photostepper resolution.

SUMMARY OF THE INVENTION

These and additional objects are accomplished by the various aspects of the present invention, wherein, briefly and generally, a method of forming a focus/exposure matrix on a wafer is provided, wherein a photostepper having a plurality of focus settings and a finite focus resolution is operated to periodically expose a layer of resist disposed on the wafer to electromagnetic radiation spatially modulated with a reference pattern so as to form a series of exposures thereon. The series of exposures have at least one exposure having a first portion being overlapped with a first adjacent exposure, a second portion being overlapped with a second adjacent exposure, and a third portion not overlapped with the first and second adjacent exposures, but being double exposed. The method also provides the steps of placing and removing the wafer to and from the photostepper and the step of removing at least a portion of the resist so as to leave a pattern disposed on the wafer defining the focus/exposure matrix.

Also provided is the wafer formed by the above described method that is used to calibrate the photostepper's focus and exposure time settings. The wafer has a focus/exposure matrix disposed thereon comprising a series of patterns. The patterns are arranged in rows and columns. The patterns in a row being characterized by having been formed with substantially the same exposure time and an effective focus that increments between successive row patterns by an amount substantially corresponding to half the focus resolution of the photostepper. The patterns in a column being characterized by having been formed with substantially the same effective focus and an exposure time that increments between successive column patterns by a finite amount.

BRIEF DESCRIPTION OF THE DRAWINGS

FIG. 1 is a symbolic diagram of a simplified photostepper for use in forming a focus/exposure matrix on a wafer as embodied in this invention;

FIG. 2 is a top view of the wafer having the focus/exposure matrix disposed thereon as embodied in this invention;

FIG. 3 is a top view of three overlapping exposures used in forming the focus/exposure matrix on the wafer as embodied in this invention;

FIG. 4 is a top view of one of the exposures in FIG. 3 being overlapped with two other exposures used in forming the focus/exposure matrix as embodied in this invention;

FIG. 5 is a top view of a combination of the overlapping exposures of FIGS. 3 and 4 used in forming the focus/exposure matrix as embodied in this invention;

FIG. 6 is a table illustrating the components of each overlapping exposure regions used in forming the focus/exposure matrix on the wafer as embodied in this invention;

FIG. 7 is a flow diagram of the steps the photostepper performs in forming the focus/exposure matrix on the wafer as embodied in this invention;

FIG. 8 is a top view of the reference pattern used in forming the focus/exposure matrix on the wafer as embodied in this invention; and FIG. 9 is a top view of another embodiment of a wafer having overlapping exposures thereon.

DETAILED DESCRIPTION OF THE PREFERRED EMBODIMENTS

Referring to FIG. 1, it shows a symbolic diagram of a simplified photostepper 11 used to create a step and repeat exposures 22 on a wafer 12. Although photosteppers in general are very complicated, including many optical-processing components such as optical filters, condensing lenses, mirrors and so forth, for illustration purposes, the photostepper 11 as shown in FIG. 1 includes the components needed to describe the various aspects of this invention. The photostepper 11 comprises various optical components, all of which are in optical communication with each other and form an optical series path linking a light source 24 at one end to a wafer 12 at an opposite end. The light source 24 is optically coupled to a reticle or mask 28 which has a reference pattern 30 disposed thereon. The reticle 28 is optically coupled to a controllable shutter 36 having an aperture therethrough defining a frame 38. The shutter 36 is optically coupled to the wafer 12 which has a layer of resist 20 disposed on the wafer 12. The wafer 12 may also include a layer of a thin-film 18 interposed between the wafer 12 and the resist 20.

In operation, the light source 24 produces a light beam 26a having a specified wavelength. As it is well known in the art, the selection of the light wavelength depends on the material used for the resist 20. The light chemically alters the resist 20 such that the resist is either weakened or strengthened relative to attacks from an etching process. The light beam 26a propagates through the reticle 28 such that a portion of the beam is blocked by the reference pattern 30 and a complementary portion of the beam propagates through the reference pattern 30 to form a patterned light beam 26b. The patterned light beam 26b will be spatially modulated with the reference pattern 30 so that its image may be exposed onto the resist 20. The patterned light beam 26b thereafter propagates through the frame 38 of the controllable shutter 36, where the contour of the patterned light beam 26b is limited by the size and shape of the frame 38 to form exposing light beam 26c. The frame 38 acts as a normally-closed optical valve which is periodically opened by the controllable shutter 38 so that the resist 20 is exposed a frame at a time. The wafer 12 sits on a chuck 32 which can be adjusted to move vertically or tilt so that the image of the reference pattern 30 can be focused upon the surface of the wafer.

As shown in FIG. 1, both the chuck 32 and the controllable shutter 36 have a series of discrete settings 34 and 40 for adjusting the focus and exposure time of each exposure, respectively. The focus settings 34 usually has a focus resolution defined as the difference in the focus between closest focus settings. For example, the Canon model no. 2500i3 photostepper, whose operation manual entitled "FPA-2500i2/i3 Parameter Guide" and published in the year 1992 is hereby incorporated by reference, provides for a focus resolution of 0.1 micron and focus settings ranging from −50 microns to +50 microns. Likewise, the exposure time settings has a finite exposure time resolution and multiple exposure time settings. For the Canon model no. 2500i3, the exposure time resolution is 0.1 $mJ/cm^2$ and has exposure time settings ranging from 0 $mJ/cm^2$ to 3000 $mJ/cm^2$. Although throughout this application, reference to the Canon model no. 2500i3 will serve as an example for illustrating this invention, it shall be appreciated that the method of forming a focus/exposure matrix on a wafer as embodied in this invention may be used with other brands of photostepper having a finite focus resolution and a plurality of focus settings. Another photostepper having these properties include the Nikon model no. GCA ASM SVG.

It is a critical step in the process of creating precise circuit patterns on a wafer, especially for patterns having small line and spacing definitions, that the focus and exposure time settings 34 and 40 be adjusted to optimum settings so that the resist is optimally exposed. As with a camera for example, if one shoots a picture with the camera being defocused, blurred images will result. Similarly, if the photostepper's focus setting is not optimum, blurred circuit pattern images will be exposed onto the resist, and as a result, blurred patterns would form on the wafer. When small line and spacing definitions are required for forming a pattern, a defocused exposure may result in blurring two lines together, where there should have been a space in between the lines. Hence, there is a need to determine the precise focus setting in order to minimize this type of blurring. Similarly, having a precise exposure time is also critical in forming a circuit pattern on a wafer. A precise exposure time depends on many factors, including the type of resist used, the thickness of the resist, and the line and spacing minimum definitions. An exposure time that is too short, for example, may result in the resist not sufficiently undergoing photochemical reactions so that it causes problems in the subsequent etching process. An exposure time that is too long may result, on the other hand, in exposing the resist in areas which are to remain unexposed. This may lead to blurring of the image formed on the resist. Hence, a precise exposure time is required to prevent insufficient photochemical reactions or blurring. This is where a focus/exposure matrix is used to determine the precise focus and exposure time settings of the photostepper in order to optimize the forming of a thin-film circuit pattern on a wafer.

Referring now to FIG. 2, it shows an archive wafer 10 comprising a silicon wafer 12 having a pattern disposed thereon defining a focus/exposure matrix 14. Although a silicon wafer is used to exemplify the various aspects of this invention, it shall be appreciated by those skilled in the art that other types of wafers can be used, such as a gallium-arsenide wafer. The focus/exposure matrix 14 comprises a series of patterns 16 which are usually, but not necessarily, arranged in rows and columns. Patterns may be either formed by patterning the resist, or patterning the wafer itself, or patterning a thin-film layer disposed on the wafer. But in the preferred embodiment, patterning the resist is chosen because the wafer 12 may be reusable. Patterns 16 are represented by squares having diagonal lines therein. Patterns 17, in the extremity of the matrix 14 and represented by squares not having diagonal lines therein, are not used in the calibrating process. They are residue patterns formed in the focus/exposure matrix forming process. For purposes of identification, the rows and columns in the matrix 14 have been sequentially numbered so that referencing a particular pattern may be facilitated by listing the row and column and enclosing it with parenthesis. The x-direction is illustrated as being generally horizontal and the y-direction is illustrated as being generally vertical, wherein the upper-left pattern is designated, for example, pattern (0,0) and the pattern pointed to by reference number 16 is designated pattern (6,7). The matrix 14 is formed such that the patterns in a row are characterized by being formed with substantially the same exposure time. For example, the exposure time corresponding to patterns (1,1) and (1,7) being substantially the same, and for illustration designated E1 (representing the exposure time for patterns in row 1). Each row having patterns formed with a distinct exposure time and preferably in an incrementing manner, such that the exposure times increases step-wise from E1 for patterns in row 1 to E7 for patterns in row 7. Also preferably, the series of increasing exposure time from E1 to E7 incrementing in a non-linear manner.

In a similar fashion, the patterns in the same column are characterized by having been formed with substantially the same effective focus. For example, the effective focus for patterns (1,4) and (5,4) being substantially the same. Each column has patterns being formed with a distinct effective focus, and preferably in an incrementing manner. In addition, patterns in every other column having an effective focus corresponding to the focus setting of the photostepper. For example, if the photostepper has focus settings −0.2, −0.1, 0, +0.1 and +0.2 micron, wherein the focus resolution is 0.1 micron, then patterns in columns 0, 2, 4, 6, 8 have effective focuses corresponding to those settings, respectively. Patterns in columns 1, 3, 5 and 7 have effective focuses approximately −0.15, −0.05, +0.05 and +0.15 micron, respectively. Accordingly, the difference in effective focus between column patterns is half the focus resolution of the photostepper, i.e. 0.05 micron focus resolution.

The focus/exposure matrix 14 is useful in calibrating the photostepper for achieving the optimum focus and exposure time setting. By examining each pattern in the focus/exposure matrix, preferably under a microscope, one can determine which pattern has been optimally exposed. By locating the optimum pattern, one can determine the optimum focus and exposure time settings for the photostepper. The creation of an archive wafer 10 and the inspection thereof is usually conducted before a production run of actual circuit wafers is processed by the photostepper. In this way, once the photostepper has been calibrated using this method, production circuit patterns should be optimally exposed, thereby resulting in less circuit pattern defects.

Referring to FIGS. 3–5, the process of which these patterns 16 are formed is by overlapping single exposures of reference pattern 30 onto the resist 20. FIG. 3 is used to illustrate how the patterns are formed so that the effective focus corresponding to adjacent column patterns differs by an amount of around half the focus resolution of the photostepper. First, an exposure 42 of reference pattern 30 is formed on the resist 20. The shape of exposure 42 being proportional to frame 38, which is preferably rectangular in shape. The preferred dimension for exposure 42 is approximately 12 millimeters in the x-direction by 8 millimeters in the y-direction. Exposure 42 is formed with an initial focus and exposure time setting, such as −0.1 micron and $E_b$.

The shutter 36 is then moved a distance of 8 millimeters (i.e. two-thirds of the long side of the rectangular frame) in the x-direction. An exposure 44 of reference pattern 30 is formed on the resist 20. The exposure 44 is formed with substantially the same exposure time $E_b$ as exposure 42 but with a focus corresponding to an adjacent focus setting, such as for example 0 micron. Accordingly, the difference in focus between exposure 42 and 44 corresponds to the focus resolution of the photostepper 11. A first overlapping region 48 is formed comprising the right third of exposure 42 overlapped with the left third of exposure 44. The effective exposure time of overlapping region 48 is the additive sum of the exposure time for exposures 42 and 44, i.e. $2E_b$. The effective focus of overlapping region 48 is the average of the focus for exposures 42 and 44, i.e., −0.05 micron.

The shutter 36 is thereafter moved another 8 millimeters (i.e. two-thirds of the long side of the rectangular frame) in the x-direction. An exposure 46 of reference pattern 30 is formed on the resist 20. The exposure 46 is formed with the substantially the same exposure time $E_b$ as exposure 44 but with a focus corresponding to an adjacent focus setting, such as +0.1 micron. A second overlapping region 52 is formed comprising the right third portion of exposure 44 and the left third portion of exposure 46. The second overlapping region 52 having an effective exposure time of $2E_b$ and an effective focus of +0.05 micron.

Exposure 44 now has a middle region 50 that is not overlapped by either adjacent exposures 42 or 46. Since overlapping regions 48 and 52 have been double exposed and region 50 is exposed only once, to be consistent, region 50 is preferably exposed again with the same exposure time and focus setting as exposure 44, i.e. $E_b$ and 0 micron. In this way, region 50 obtains an effective exposure time of $2E_b$ and an effective focus of 0 micron. The way in which the photostepper accomplishes this is by positioning the shutter 36 where exposure 44 was shot, but narrowing frame 38 so that only the middle portion of reference pattern 30 exposes the resist. The net result is that overlapping regions 48, 50 and 52 have substantially the same effective exposure time, i.e. $2E_b$ and an effective focus of −0.05, 0 and +0.05 micron, respectively. Thus, the difference in effective focus between adjacent regions is half the focus resolution of the photostepper, and at least one region has an effective focus corresponding to a focus setting of the photostepper, i.e. region 50 has an effective focus of 0 micron corresponding to the 0 micron focus setting.

FIG. 4 is used to illustrate how the patterns 16 are formed so that patterns in adjacent rows have differing exposure time. An exposure 54 of reference pattern 30 is formed on the resist such that a lower-half portion of exposure 54 is overlapped with an upper-half portion of internal exposure 44, forming a third overlapping region 58. Exposure 54 has been formed with the same focus setting as exposure 44, i.e. 0 micron for example, and with an exposure time of $E_a$, for example. In this manner, overlapping region 58 has an effective exposure time of $(E_a+E_b)$. An exposure 56 of reference pattern 30 is formed on the resist 20 such that an upper-half portion of exposure 56 is overlapped with a lower-half portion of exposure 44 forming a fourth overlapping region 60. The exposure 56 being formed with the same focus setting as exposure 44, i.e. 0 micron for example, and an exposure time of $E_c$, for example. In this manner, overlapping region 60 obtains an effective exposure time of $(E_b+E_c)$. Preferably, $E_a$, $E_b$, $E_c$ and subsequent exposure times corresponding to additional rows form a series of incrementing exposure time, and which preferably, increments in a non-linear fashion.

When the steps as discussed above with respect to FIGS. 3 and 4 are combined, overlay exposure regions 62, 64, 66, 68, 70 and 72 are formed as shown in FIG. 5. The components of each overlay exposure regions are tabulated in FIG. 6. These overlay exposure regions are formed within exposure 44. Overlay exposure region 62, 66, 68 and 72 are formed with four overlapping exposures; and overlapping regions 64 and 70 are formed with two overlapping double exposed regions. For example, overlay exposure region 62 is formed by the overlapping of exposures 74, 54, 42 and 44. Overlay region 64 is formed by the overlapping of exposure 54 and 44, both of which are double exposed in that region. The result of this overlapping of exposures is that overlay exposure regions 62, 64 and 66 are characterized as having substantially the same effective exposure time, i.e. $2(E_a+E_b)$, and an effective focus of −0.05, 0 and +0.05 micron, respectively. Overlay exposure regions 68, 70 and 72 are characterized as having been formed with substantially the same exposure time, i.e. $2(E_b+E_c)$, and an effective focus of −0.05, 0 and +0.05 micron, respectively.

Relating these overlay exposure regions back to the focus exposure matrix 14 in FIG. 2, the process of creating the overlay exposure regions are stepped and repeated by incrementing the focus and exposure time to form a matrix of overlay exposure regions. The wafer having this overlay exposure matrix 22 is subsequently removed from the photostepper and undergoes an etching process. The remaining pattern disposed on the wafer after the etching process is completed defines the focus/exposure matrix 14. Each overlay exposure region corresponds to a pattern 16 of the focus/exposure matrix 14. As an example, overlay exposure regions 62, 64, 66, 68, 70 and 72 may have been the overlay exposures forming patterns (1,3), (1,4), (1,5), (2,3), (2,4) and (2,5), respectively. Residue patterns 17 surrounding the patterns 16 are not useable because they lack an adjacent pattern needed to form the overlay exposure regions.

FIG. 7 shows a flow diagram illustrating the steps in which the photostepper 11 undertakes to expose the resist 20 so that the focus/exposure matrix 14 may be formed. Although the diagram shows a preferred method of exposing the resist 20, it shall be appreciated that there are many ways to program the photostepper to expose the resist so that the same exposures form. However, prior to beginning the process of forming a focus exposure matrix, it is preferable to locate a wafer having a relatively flat surface. Some photosteppers, such as the Canon model no. 2500i3, have a wafer flatness checking function built in. This function can check the surface height of up to 500 locations on a wafer. This function can be used to determine the flatness of a wafer, and accordingly, a relatively flat wafer can be chosen. A layer of resist 20 is thereafter disposed over the surface of the wafer 12.

The method of forming the focus/exposure matrix 14 on the wafer 12 is to first place the wafer 12, having the resist 20 disposed thereon, on the photostepper 11 such that the resist may be exposed to exposing radiation 26d. The photostepper 11 is first subject to an initializing step 82. At this step, the photostepper 11 is operated so that the frame 38 is positioned near an upper-left portion of the wafer 12. This position is designated the initial x-position $P_{ox}$ and the initial y-position $P_{oy}$, which at this step in the process is also the current x-position $P_{cx}$ and the current y-position $P_{cy}$. The photostepper's frame dimension SH is approximately 12 millimeters in the x-direction and 8 millimeters in the y-direction. The focus and exposure times settings of the photostepper 11 are initialized with an initial focus setting of $F_o$, which is also the current focus setting $F_c$, and an initial exposure time setting $E_o$, which is also the current exposure time setting $E_c$. In this step, an initial count is set to 0 (zero), denoting that the photostepper 11 will perform a first step and repeat exposure process with 12×8 millimeters squared sized exposures. After the first step and repeat exposure process is completed, the count is incremented to 1 to denote that a second step and repeat exposure process will be performed to double expose the middle portion of each 12×8 exposure. Also a direction indicator D will be set to 1 (one) at this step, denoting the direction in the x-direction in which the photostepper will expose a row of exposures. When D=1, the direction will be in the positive x-direction; when D=−1, the direction will be in the negative x-direction.

The photostepper 11 is then operated to expose the resist 20 to a row of exposures. This is accomplished by the loop defined by steps 84, 86 and 88. An exposure of the resist 20 is performed at step 84 at the initial position $P_{ox}$ and $P_{oy}$. In step 86, the position of the photostepper frame 38 is moved 8 millimeters in the positive x-direction. That is a movement of around two-thirds the size of the frame in the x-direction. At this step, the current focus $F_c$ is also incremented by ΔF, the focus resolution of the photostepper 11. Step 88 checks whether the current frame x-position $P_{cx}$ has reached the end of the row, denoted as $P_{ex}$. Accordingly, prior to reaching the end of the row, the photostepper 11 will be repeating steps 84 and 86 so that a row of exposures are formed.

Once the frame position is at an end of a row, this occurs when $P_{cx}=P_{ex}$, in step 90 the frame position is then moved 4 (four) millimeters in the y-direction. This is a movement of around one-half the frame size in the y-direction. At this step, the current exposure time setting $E_c$ is also incremented by ΔE, a preselected number such that the focus/exposure matrix have a sufficient exposure time range so that there is a good probability that the optimum exposure time setting falls within this range. Step 92 checks whether the current frame y-position $P_{cy}$ has reached the end of the columns of exposure $P_{ey}$. If it has not, the photostepper 11 proceeds to form another row of exposure. This is accomplished by changing the direction D to −1 in step 94 so that a row of exposures are formed in the negative x-direction. Changing D to −1 causes the position in step 86 to move in the negative x-direction, and also causes the focus to decrement. This is an efficient method of forming the exposures since the photostepper 11 zig-zags through the process. Step 96 multiplies the change in exposure time ΔE by N so that the exposure time increments in a non-linear fashion. That is, each successive row of exposures starting from the first will have an exposure time of $E_c$, $E_c$+ΔE, $E_c$+NΔE, $E_c$+N²ΔE, $E_c$+N³ΔE and so on, respectively. Because the power of the multiplication factor N is increased for successive rows, a non-linear incrementing of the exposure time results.

Once the photostepper has exposed the last row of exposures, this occurs when $P_{cy}=P_{cx}$ it is time to double expose each exposure's non-overlapping region, such as 50. Step 98 checks whether the count is equal to 1 (one); if it is not, then the photostepper 11 proceeds to double expose all regions 50. First, step 100 increments the count so that it equals 1 (one). This is done so that once all double exposures are completed, step 98 ends the photostepping process. In step 102, the photostepper 11 is initiated again. The current x and y frame positions, $P_{cx}$ and $P_{cy}$, are returned to the initial position, $P_{ox}$ and $P_{oy}$. The current focus $F_c$ and the current exposure time $E_c$ are also returned to its initial values, $F_o$ and $E_o$, respectively. The direction D is set to 1 (one) so that the photostepper exposes the first row moving in the positive x-direction. However, the second initializing step 102 changes the frame size to 4×8 millimeters squared so that only the middle overlapping region 50 of each exposure is double exposed. Steps 84 through 96 are repeated again in the same manner until all the overlapping regions 50 are double exposed. These steps are completed when step 98 determines that the count is equal to one. Once this occurs, the process of exposing the resist 20 is completed. The wafer 12 is then removed and the resist 20 is developed so as to leave a pattern disposed on the wafer 12 defining the focus/exposure matrix 14.

FIG. 8 shows a typical pattern 16 used in forming the focus/exposure matrix 14. It comprises a series of parallel lines 104 and parallel spacings 106, wherein each spacing separates each line. The width of the lines $L_w$ and spacings $S_w$ should coincide with the smallest line and space definitions of the production circuit patterns which are subsequently going to be formed using the photostepper. In other words, if the production circuit pattern have 0.6 micron as its smallest line and spacing definitions, then the pattern 16 preferably should have line width $L_w$ and space width $S_w$ approximately 0.6 micron wide. Similarly, if the circuit pattern have 0.4 micron as its smallest line and spacing definitions, then line width $L_w$ and space width $S_w$, preferably should be around 0.4 micron. This insures that when the focus/exposure matrix 14 is examined to determine the optimum focus and exposure time settings, the precision of the lines 104 and spacings 106 of the optimum pattern will correspond to the precision of the smallest lines and spacings of the production circuit pattern. This will also allow one to determine whether these dimensions are achievable.

Although throughout the discussion of the preferred method of forming the focus/exposure matrix 14, overlapping exposures were described as being substantially square and uniformly overlapping each other so that each exposure overlap a third-end of an adjacent exposure, it shall be appreciated by those skilled in the relevant art that the same effect is produced even though the overlapping exposures are neither uniform nor substantially rectangular in shape. As shown in FIG. 9, the overlapping effect can also be accomplished by the non-uniform shapes and sizes, such as exposures 108. As long as there is an exposure 108 that has a first portion that is overlapped with a first adjacent exposure 110, a second portion being overlapped with a second adjacent exposure 112, and a middle portion not overlapped, but double exposed, that would suffice to create the same overlapping effect to form a focus/exposure matrix. In addition, there is no requirement that the matrix be formed centered at the middle of the wafer, although that is the preferred method. The matrix may be formed at an end of a wafer as shown in FIG. 9.

It is to be understood that while the invention has been described above in conjunction with preferred specific embodiments, the description and examples are intended to illustrate and not limit the scope of the invention, which is defined by the scope of the appended claims.

It is claimed:

1. A wafer for use in optimizing the focus and exposure time of a photostepper, wherein the photostepper has a plurality of focus settings and a finite focus resolution, comprising:

a focus/exposure matrix comprising a series of thin-film patterns disposed on said wafer, the patterns being arranged in rows and columns, the patterns in a row being characterized by having been formed with the same exposure time and an effective focus that increments between successive patterns by an amount half the focus resolution of the photostepper, the patterns in a column being characterized by having been formed with the same effective focus and an exposure time which increments between successive patterns.

2. A wafer as defined in claim 1 wherein each pattern is of the same size.

3. A wafer as defined in claim 2 wherein each pattern is square in shape.

4. A wafer as defined in claim 3 wherein each pattern occupies an area approximately four millimeters square.

5. A wafer as defined in claim 4 wherein each pattern comprises of a series of parallel lines and spacings.

6. A wafer as defined in claim 5 wherein the width of the lines and spacings is approximately six microns.

7. A wafer as defined in claim 6 wherein the width of the lines and spacings is approximately four microns.

8. A wafer as defined in claim 1 wherein all increments of exposure time between successive column patterns forms a series of increments that varies non-linearly.

* * * * *